United States Patent [19]
Shigemori et al.

[11] Patent Number: 5,302,921
[45] Date of Patent: Apr. 12, 1994

[54] PIEZOELECTRIC OSCILLATOR HAVING REDUCED RADIATION OF HIGHER HARMONICS

[75] Inventors: Mikio Shigemori; Toru Oida; Shigeru Hirasawa; Katsumi Yamamura, all of Nagano, Japan

[73] Assignee: Seiko Epson Corporation, Tokyo, Japan

[21] Appl. No.: 869,767

[22] Filed: Apr. 16, 1992

[30] Foreign Application Priority Data

| May 31, 1991 | [JP] | Japan | 3-129802 |
| May 31, 1991 | [JP] | Japan | 3-129803 |
| May 31, 1991 | [JP] | Japan | 3-129804 |
| May 31, 1991 | [JP] | Japan | 3-129805 |
| Jun. 19, 1991 | [JP] | Japan | 3-147380 |
| Mar. 30, 1992 | [JP] | Japan | 4-71996 |

[51] Int. Cl.⁵ .................. H03B 5/36; H03B 1/04; H03L 5/00
[52] U.S. Cl. ......................... 331/67; 331/68; 331/77; 331/105; 331/116 R; 331/158; 331/186
[58] Field of Search .............. 331/67, 68, 77, 105, 331/116 R, 158, 185, 186

[56] References Cited

U.S. PATENT DOCUMENTS

| 3,863,175 | 1/1975 | Kent | 331/77 X |
| 4,328,572 | 5/1982 | Kawahara | 331/185 X |
| 4,338,576 | 7/1982 | Takahashi et al. | 331/67 |
| 4,916,413 | 4/1990 | Nakayama et al. | 331/68 |

FOREIGN PATENT DOCUMENTS

| 0228941 | 7/1987 | European Pat. Off. | 331/77 |
| 55-11670 | 1/1980 | Japan . |
| 62-14585 | 6/1987 | Japan . |
| 62-22410 | 10/1987 | Japan . |

*Primary Examiner*—Siegfried H. Grimm
*Attorney, Agent, or Firm*—Ladas & Parry

[57] ABSTRACT

A piezoelectric oscillator in which radiation of higher harmonic components is reduced. A piezoelectric vibrator and a semiconductor device are provided in an oscillation circuit for making the piezoelectric vibrator oscillate, as is a filter for cutting components in a predetermined frequency band or higher harmonic components of an oscillation signal outputted from the semiconductor device. The piezoelectric vibrator, the semiconductor device and the filter are packed in one package. Radiation of the higher harmonic components is reduced by placing the filter close to the oscillator, by providing a shielding or by operating portions of the oscillator output circuit with a reduced supply voltage.

13 Claims, 17 Drawing Sheets

$C1 < C2 < C3 < C4 < C5 \text{-----} < Cn$ $L1 < L2 < L3 < L4 < L5 \text{-----} < Ln$

STRUCTURE IN SECTION

PIEZOELECTRIC OSCILLATOR HAVING REDUCED RADIATION OF HIGHER HARMONICS

BACKGROUND OF THE INVENTION

The present invention relates to a piezoelectric oscillator having a piezoelectric vibrator and an oscillation circuit which are packed in one package and relates to an electronic appliance having such a piezoelectric oscillator incorporated therein. The present invention particularly relates to a manner how to reduce higher harmonic components.

Heretofore, in such a piezoelectric oscillator, an output from the oscillation circuit is led to the outside of the package through a bonding wire and a lead frame. However, the output contains a lot of higher harmonic components because the output has a rectangular waveform. Accordingly, radiation of the higher harmonic components increases so that it may have an influence on peripheral equipments. Reduction of radiation of such higher harmonic components has been therefore required.

SUMMARY OF THE INVENTION

Upon such circumstances, an object of the present invention is to provide a piezoelectric oscillator, an electronic part and an electronic appliance in which radiation of higher harmonic components can be reduced.

The piezoelectric oscillator according to an aspect of the present invention has a piezoelectric vibrator, a semiconductor device provided therein with an oscillation circuit for making the piezoelectric vibrator oscillate, and a filter for cutting components in a predetermined frequency band or higher harmonic components of an oscillation output from the semiconductor device, those piezoelectric vibrator, semiconductor device and filter being packed in one package. Because those parts are packed in one package, higher harmonic components of an oscillation signal outputted from the piezoelectric oscillator can be cut so effectively that radiation of the higher harmonic components can be reduced.

In the piezoelectric oscillator according to another aspect of the present invention, the filter may be constituted by a distributed constant noise attenuation element, or a pair of meandering lead frames arranged so as to be opposite to each other at a predetermined distance, or a combination thereof. In the case where the filter is constituted by a distributed constant noise attenuation element, higher harmonic components can be cut effectively. In the case where the filter is constituted by a pair of lead frames, the filter can be formed without provision of any other parts.

In the piezoelectric oscillator according to a further aspect of the present invention, the semiconductor device may be provided therein with an oscillation circuit and an output buffer, or may be provided therein further with an oscillation buffer, a frequency dividing circuit and an output buffer in addition to the oscillation circuit and the output buffer. The semiconductor device is provided therein further with a voltage regulator for applying a low voltage as a driving voltage to at least part of those elements. Because the driving voltage applied to a circuit incorporated in the semiconductor device is low at least part of the incorporated circuit, the signal level can be made low correspondingly and hence the signal level of higher harmonic components can be made low, so that the influence of the higher harmonic components can be reduced correspondingly.

In the piezoelectric oscillator according to a further aspect of the present invention, the filter is provided in the output side of the semiconductor device. Accordingly, distortion of the output waveform due to reflection wave is avoided, so that trigger error can be reduced in the side of an electronic part such as an IC receiving the output waveform. Further, the symmetrical characteristic of the waveform can be improved. That is, in the case where the aforementioned filter is not provided, reflection wave is superimposed upon the output waveform to thereby distort the waveform. Particularly, if there is any waveform distortion in the neighbor of the input threshold level in an external IC, trigger error may occur to bring operation error. According to the present invention, this problem can be avoided. Further, in the present invention, a filter may be provided in an electric source line. Accordingly, higher harmonic components going out of the electric source can be cut, so that radiation of the higher harmonic components can be reduced.

In the piezoelectric oscillator according to a further aspect of the present invention, the filter is provided in an input or output line of the semiconductor device and includes cancel lines arranged to interfere with each other to cancel radiation. The cancel lines may include a pair of meandering lead frames arranged so as to be opposite to each other at a predetermined distance. Owing to the cancel lines, radiations of higher harmonic interfere with each other to thereby cancel each other so that outside-appearing radiation of the higher harmonic components can be reduced. In the case where the cancel lines are constituted by a pair of lead frames, other parts need not be provided.

In the piezoelectric oscillator according to a further aspect of the present invention, the semiconductor device and the filter are incorporated in an IC chip. Because the filter is formed in the IC chip, higher harmonic components can be removed effectively.

In the piezoelectric oscillator according to a further aspect of the present invention, the semiconductor device is incorporated in an IC chip covered with a shielding film over its upper surface. Because the IC chip is covered with a shielding film over its upper surface, not only noise from the outside can be avoided but radiation of higher harmonic components can be reduced.

The piezoelectric oscillator according to a further aspect of the present invention further has a lead frame put between shielding plates through insulating layers. Accordingly, radiation of higher harmonic components from the lead frame can be reduced.

The piezoelectric oscillator according to a further aspect of the present invention comprises: a piezoelectric vibrator; a semiconductor device having a function of making the piezoelectric vibrator oscillate and including therein at least one oscillation circuit and at least one output buffer; and a voltage regulator for applying a low voltage as a driving voltage to part of those elements described above, the piezoelectric vibrator and the semiconductor device being packed in one package. Because the driving voltage applied to a circuit incorporated in the semiconductor device is low at least part of the incorporated circuit, the signal level can be made low correspondingly and hence the signal level of higher harmonic components can be made low, so that the influence of the higher harmonic components can be reduced correspondingly.

The electronic part according to a further embodiment of the present invention comprises an IC, and a filter connected to the IC and provided for cutting components in a predetermined frequency band or higher harmonic components, these IC and filter being packed in one package. Accordingly, higher harmonic components of a signal outputted from the IC are cut so that radiation of the higher harmonic components can be reduced.

The electronic apparatus according to a further embodiment of the present invention comprises therein an electronic part constituted by an IC, and a filter connected to the IC for cutting components in a predetermined frequency band or higher harmonic components, the IC and filter being packed in one package. Accordingly, radiation of higher harmonic components is reduced in the electronic apparatus, so that interference between electronic parts can be reduced.

The above and other objects as well as advantageous features of the present invention will become more clear from the following description taken in conjunction with the drawings.

DESCRIPTION OF THE PREFERRED EMBODIMENTS

Figure 1:
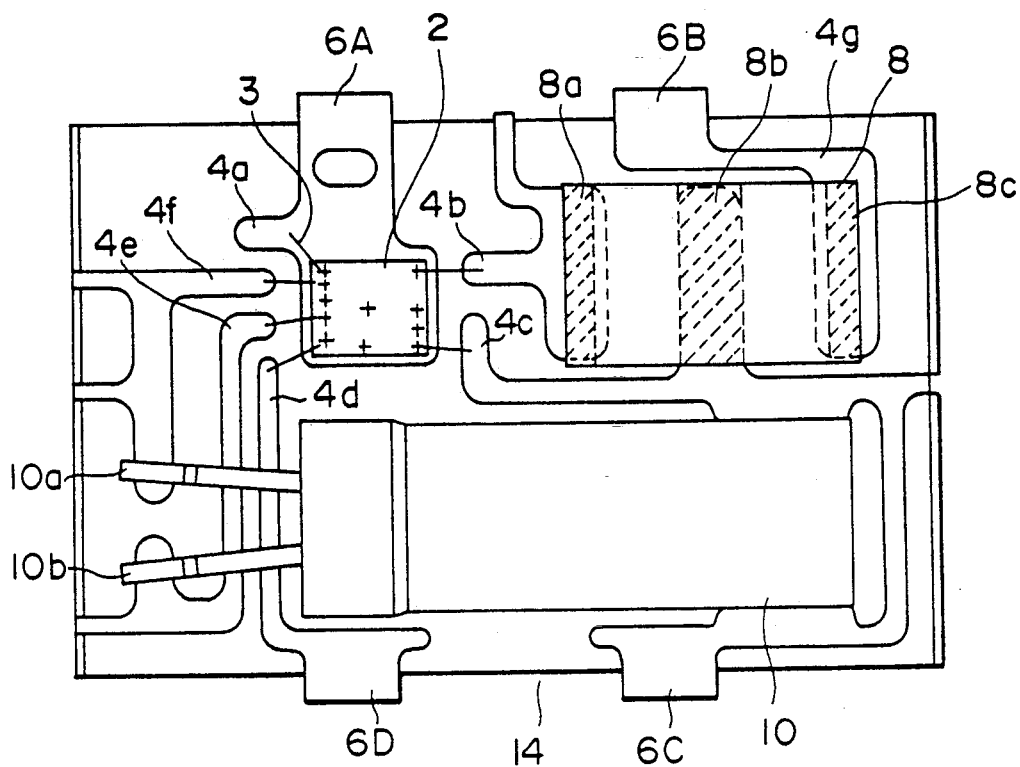
FIG. 1 is a plan view of a quartz oscillator as an embodiment of the present invention.
Figure 2:
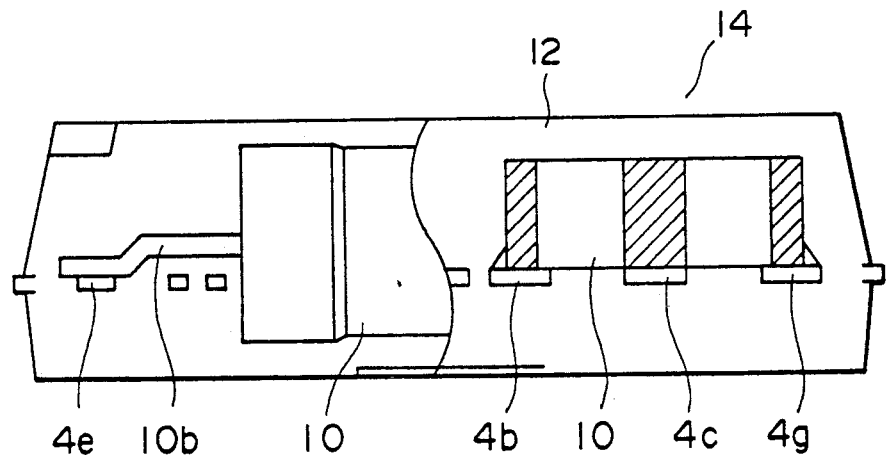
FIG. 2 is a front sectional view of the quartz oscillator depicted in FIG. 1.

FIG. 1 is a plan view of a quartz oscillator as an embodiment of the present invention, and FIG. 2 is a front sectional view thereof. In this embodiment, a semiconductor device 2 having a function of oscillating a crystal resonator is connected to lead terminals 4a to 4f (there are other several to tens of lead terminals which are however omitted in the drawing) through bonding with Au lead wires 3. The lead frame of the lead terminal 4a is connected to an outer lead 6A to which a source voltage VDD is applied. An input terminal 8a of a filter 8 is directly connected to the lead frame of the lead terminal 4b. The lead frame of the lead terminal 4c is directly connected to a ground terminal 8b of the filter 8 and, at the same time, it is connected to an outer lead 6C connected to a ground potential. The lead frame of the lead terminal 4d is connected to an outer lead 6D to which a control signal is supplied. The lead terminals 4e and 4f are led so as to be connected to outer leads 10a and 10b, respectively.

An output terminal 8c of the filter 8 is connected, through the lead terminal 4g, to an outer lead 6B of a crystal resonator 10 for outputting an oscillation signal. The filter 8 is connected to the lead frame of the lead terminal 4c as a ground terminal at the shortest distance in order to improve the filter characteristic thereof. Further, each of the aforementioned lead frames has a radius R of curvature with which the curved portion thereof changes smoothly.

The aforementioned semiconductor device 2, the lead terminals 4a to 4g, the outer leads 6, the filter 8 and the crystal resonator 10 are packed in a package 12 by transfer molding using epoxy resin or the like.

Because the quartz oscillator 14 is constructed so that the oscillation output from the semiconductor device 2 is picked out of the outer lead 6B through the filter 8 contained in the package 12, higher harmonic components are cut from the output. Accordingly, radiation of the higher harmonic components can be reduced.

Figure 3:
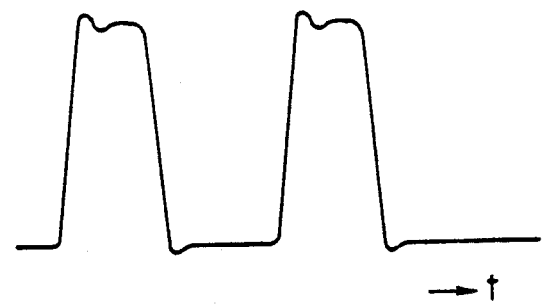
FIG. 3 is a graph of an output waveform in a conventional method.
Figure 4:
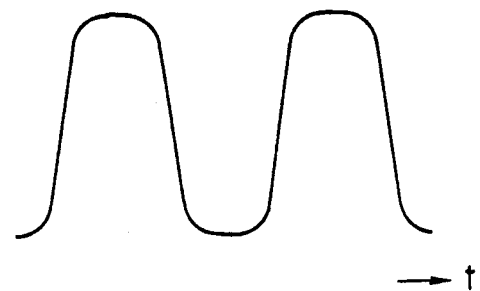
FIG. 4 is a graph of an output waveform in this embodiment of the present invention.
Figure 5:
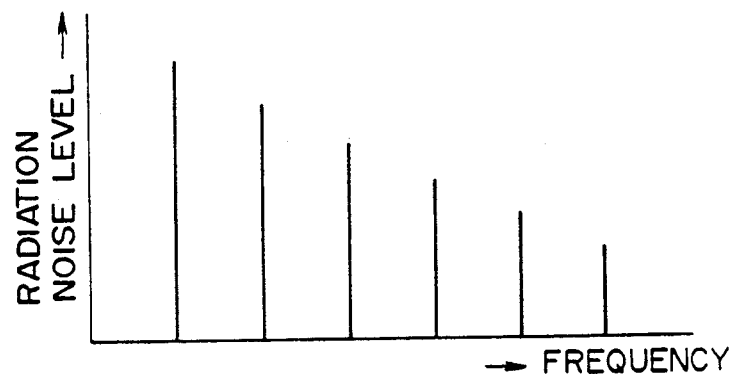
FIG. 5 is a characteristic graph showing a radiation spectrum in the conventional method.
Figure 6:
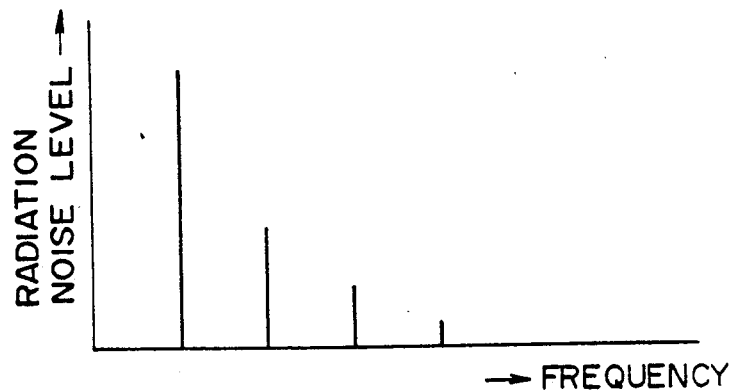
FIG. 6 is a characteristic graph showing a radiation spectrum in this embodiment of the present invention.

FIG. 3 is a graph showing an output waveform in a conventional method, and FIG. 4 is a graph showing an output waveform in the aforementioned embodiment of the present invention. FIG. 5 is a characteristic graph of a radiation spectrum in the conventional method, and FIG. 6 is a characteristic graph of a radiation spectrum in the aforementioned embodiment of the present invention. As is obvious from these graphs, the output in the embodiment of the present invention exhibits a waveform in which higher harmonic components are cut and, accordingly, radiation of the higher harmonic components are reduced.

Figure 7:
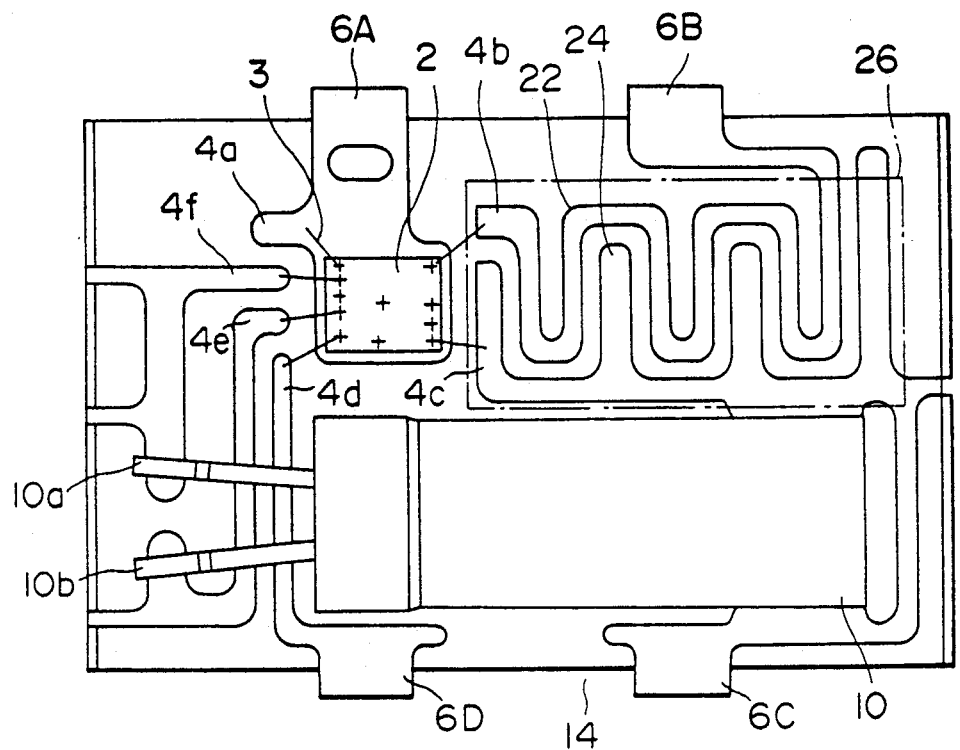
FIG. 7 is a plan view of a quartz oscillator as another embodiment of the present invention.
Figure 8:
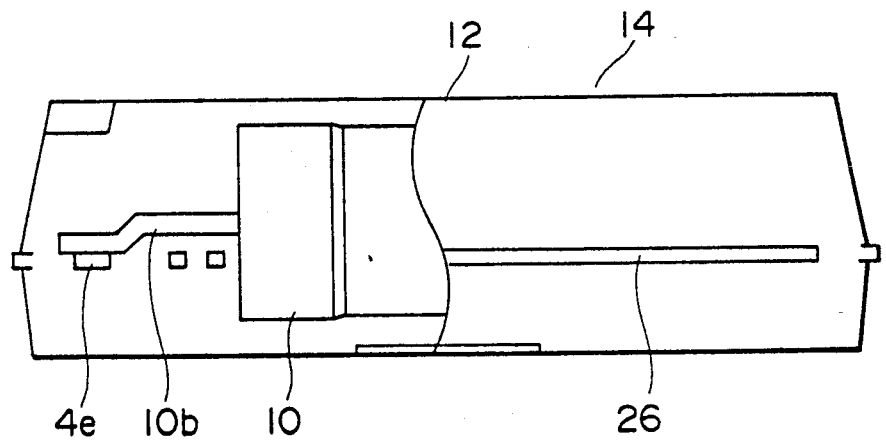
FIG. 8 is a front sectional view of the quartz oscillator depicted in FIG. 7.

FIG. 7 is a plan view of a quartz oscillator as another embodiment of the present invention, and FIG. 8 is a front sectional view thereof. In this embodiment, the filter 8 shown in FIGS. 1 and 2 is replaced by a filter 26. The filter 26 is constituted by meandering lead frames 22 and 24 (respectively connected to the lead terminals 4b and 4c) which are arranged so as to be opposite to each other at a predetermined distance. That is, the lead terminal 4b is connected to the oscillation output of the semiconductor device 2 and the lead terminal 4c is connected to the ground potential, so that by arranging the two lead frames as described above, a capacitor can be formed by the electrostatic capacity between the lead frames. Thus, the filter 26 can be formed.

Figure 9:
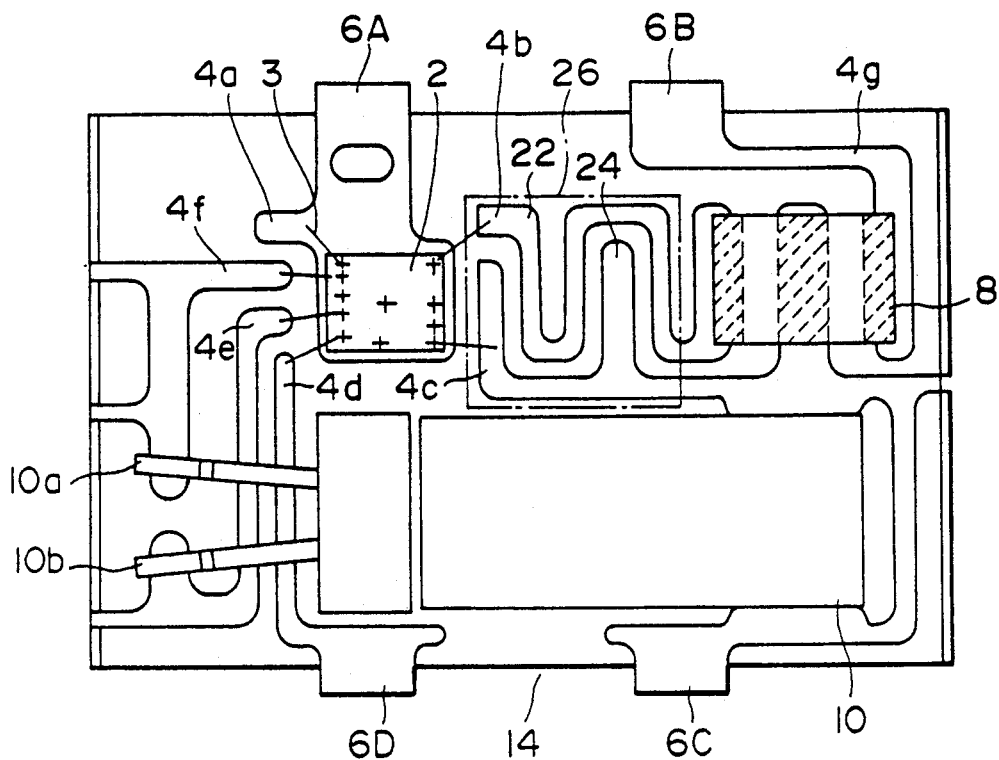
FIG. 9 is a plan view of a quartz oscillator as a further embodiment of the present invention.
Figure 10:
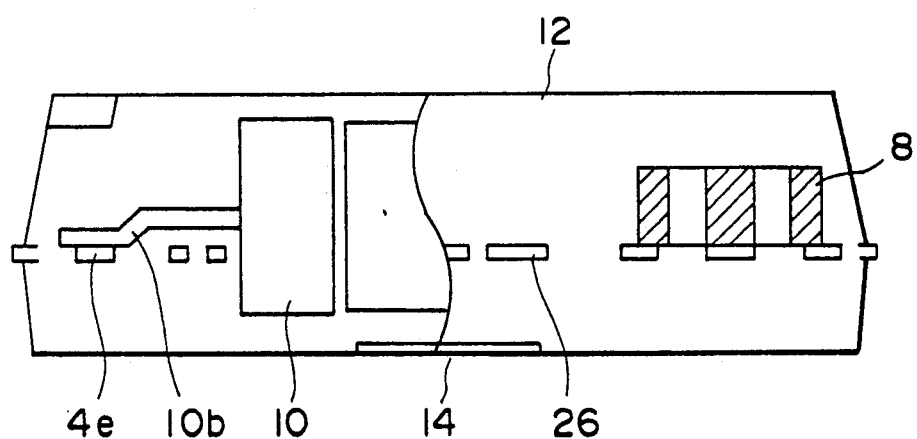
FIG. 10 is a front sectional view of the quartz oscillator depicted in FIG. 9.

FIG. 9 is a plan view of a quartz oscillator as a further embodiment of the present invention, and FIG. 10 is a front sectional view thereof. In this embodiment, a filter structure is formed by using the filter 8 in FIG. 1 and the filter 26 in FIG. 7 in combination. That is, a filter structure is formed by parallel connection of filters 26 and 8 between the oscillation output of the semiconductor device 2 and the outer lead 6B.

Figure 11:
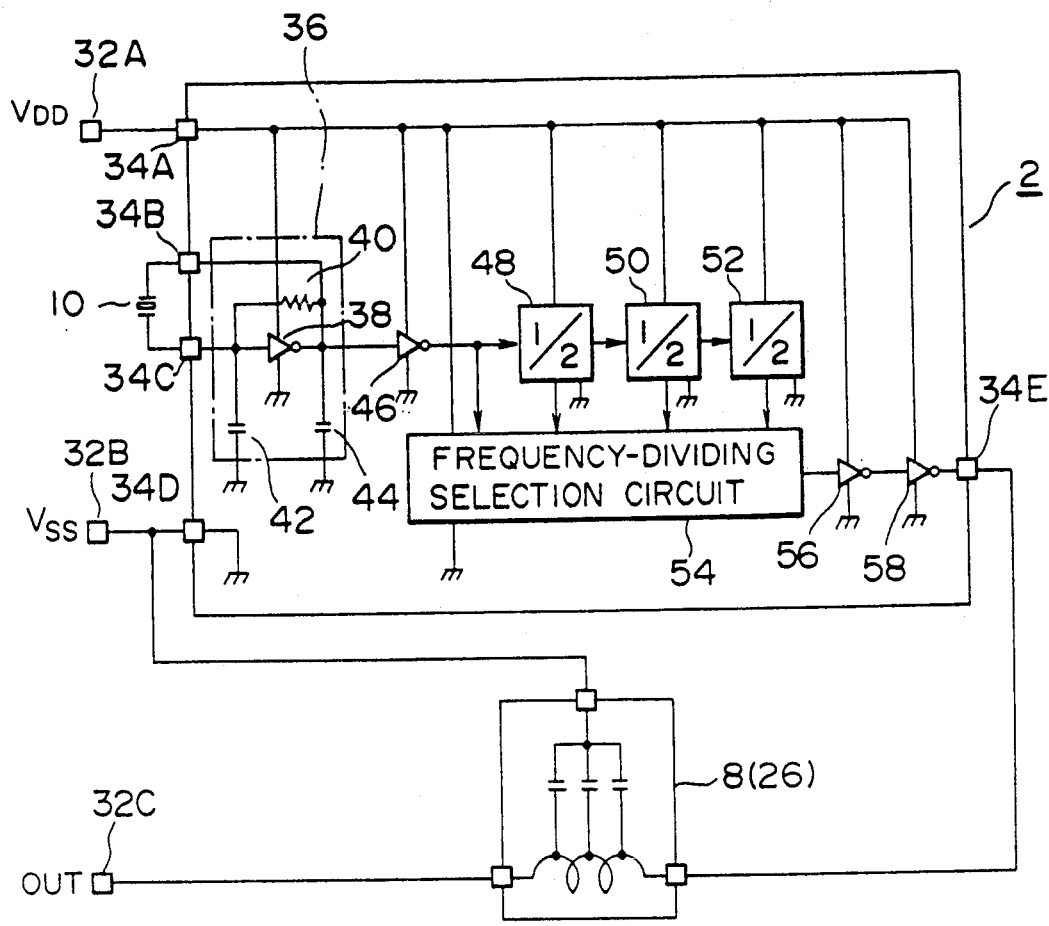
FIG. 11 is a circuit diagram of the quartz oscillator depicted in FIGS. 1 and 2 or in FIGS. 7 and 8.

FIG. 11 is a circuit diagram of the quartz oscillator in the embodiment depicted in FIGS. 1 and 2 or in the embodiment depicted in FIGS. 7 and 8. In FIG. 11, a source voltage from the outside is supplied to across a VDD terminal 32A and a VSS terminal 32B, so that an output signal is taken out from an output terminal 32C. A VDD pad 34A is connected to the VDD terminal 32A, and a VDD pad 34D is connected to the VSS terminal 32B, so that the source voltage is supplied to the semiconductor device 2 through these pads. A crystal resonator 10 is connected between a drain pad 34B and a gate pad 34C. The VSS pad 34D is connected both to a ground circuit of the semiconductor device 2 and to the filter 8. An output pad 34E is connected to the filter 8, and the output of the filter 8 is connected to the output terminal 32C.

An oscillation circuit 36 is composed of an oscillation inverter 38 for oscillating the crystal resonator 10, a feedback resistor 40, a gate capacitor 42 and a drain capacitor 44. An oscillation buffer 46 amplifies the output of the oscillation circuit 36. Frequency-dividing circuits 48, 50 and 52 are connected in series and each of the frequency-dividing circuits serves to divide the frequency of the respective input signal with the frequency-dividing ratio of $\frac{1}{2}$. Accordingly, the frequency-dividing circuit 48 serves to divide the output signal of the oscillation circuit 36 with the ratio of $\frac{1}{2}$, the frequency-dividing circuit 50 serves to divide the output signal of the oscillation circuit 36 with the ratio of $\frac{1}{4}$, and the frequency-dividing circuit 52 serves to divide the output signal of the oscillation circuit 36 with the ratio of $\frac{1}{8}$. A frequency-dividing selection circuit 54 is a circuit for selecting the frequency-dividing dividing ratio (1/1, $\frac{1}{2}$, $\frac{1}{4}$ or $\frac{1}{8}$) in the oscillation circuit 36. An output pre-buffer 56 and an output buffer 58 amplify a signal from the frequency dividing selection circuit 54 and supply the amplified signal to the output terminal 32C through the filter 8 (26).

Figure 12:
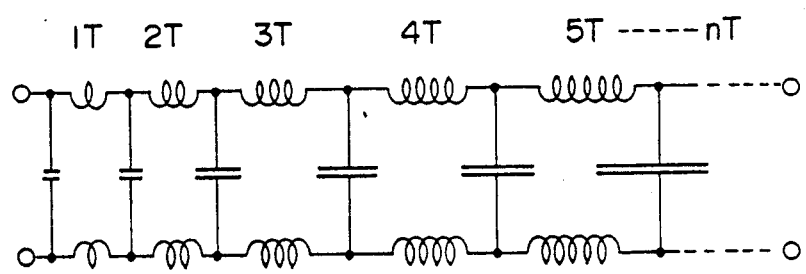
FIG. 12 is a diagram of a circuit equivalent to the filter depicted in FIG. 11.

FIG. 12 is a diagram of a circuit equivalent to the filter 8. The circuit shown in FIG. 12 is constituted by a distributed constant noise attenuation element. The distributed constant noise attenuation element has a structure in which two opposite electric conductors are wound, so that not only L and C are distributed continuously but the two electric conductors are coupled with each other electrostatically and inductively. Accordingly, the filter is formed as a distributed circuit as shown in FIG. 12. Furthermore, the unit distributed capacity of L and C changes, so that a high attenuation characteristic for a wide band can be provided. Consequently, the size of the element can be reduced.

The operation of the quartz oscillator having the aforementioned structure is as follows. When the oscillation circuit 26 oscillates the crystal resonator 10, the signal from the crystal resonator 10 is amplified by the oscillation buffer 46. The amplified signal is frequency-divided by the frequency-dividing circuits 48 to 52, so that a signal divided with the frequency-dividing ratio selected by the frequency-dividing selection circuit 54 is taken out. Then, the signal is amplified by the output pre-buffer 56 and the output buffer 58, so that the amplified signal is supplied to the filter 8 (26). The signal supplied from the output buffer 58 to the filter 8 (26) is further supplied to the output terminal 32C after higher harmonic components thereof are cut.

The filter 8 (26) is arranged adjacent to the oscillation circuit 36 because the filter 8 (26) as well as the semiconductor device are provided in the package 12. Accordingly, higher harmonic components contained in the oscillation circuit 36 are cut at an early time, so that the influence of the higher harmonic components can be reduced.

Figure 13:
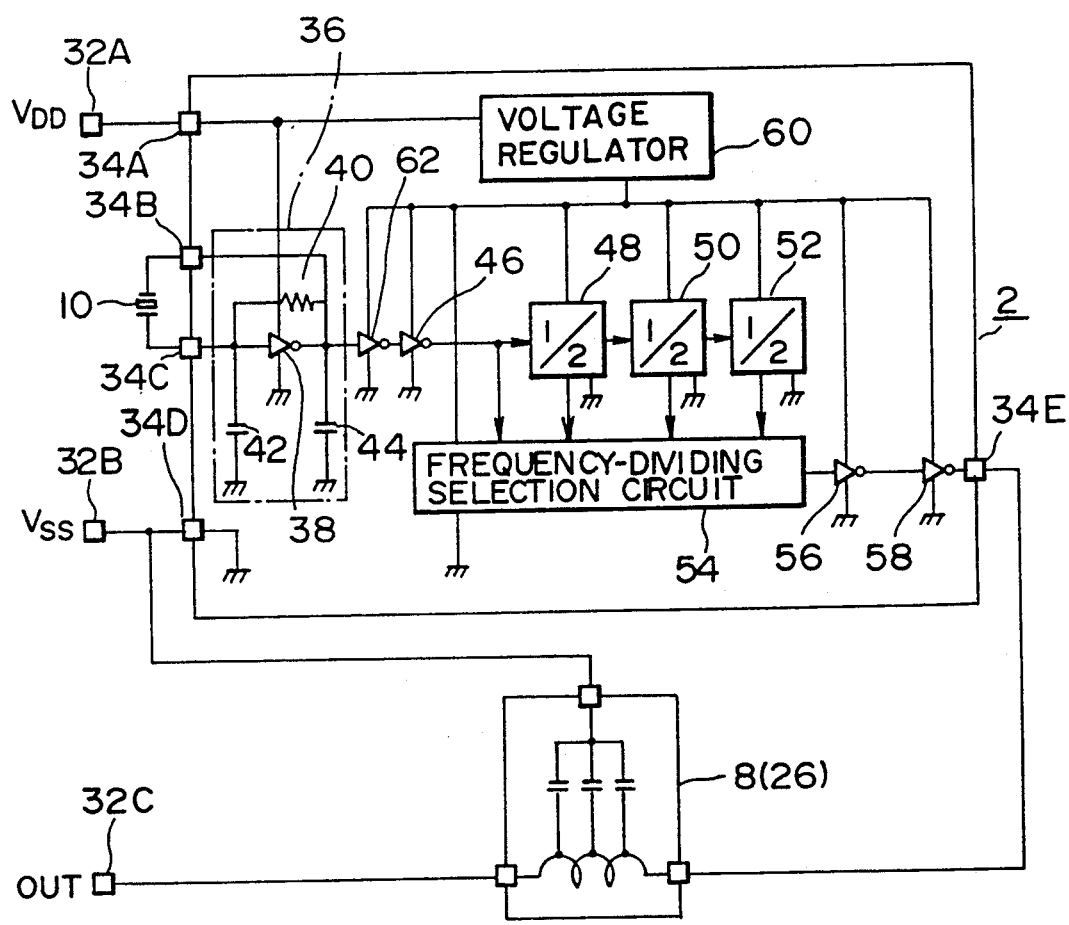
FIG. 13 is a circuit diagram of a quartz oscillator as a further embodiment of the present invention.

FIG. 13 is a circuit diagram of a quartz oscillator as a further embodiment of the present invention. In this embodiment, a source voltage is dropped to a voltage value (for example, from 5 V to 3 V) by a voltage regulator 60 to drive the respective parts (from the oscillation buffer 46 to the output buffer 58) on the basis of the lowered voltage value. The original high-voltage source voltage is directly applied to the oscillation circuit 36 to start up the oscillation of the crystal resonator 10 securely. Because the voltage for driving the oscillation circuit 36 is different from the voltage for driving the respective parts after the oscillation buffer 46, a level shifter 62 is provided therebetween to transform a 5 V signal into a 3 V signal.

As described above, the voltage for driving the respective parts (circuits) after the oscillation circuit 46 is provided as a low voltage, so that the level of the signal becomes low. Accordingly, the signal level of the higher harmonic components becomes low, so that radiation of the higher harmonic components can be reduced.

Figure 14:
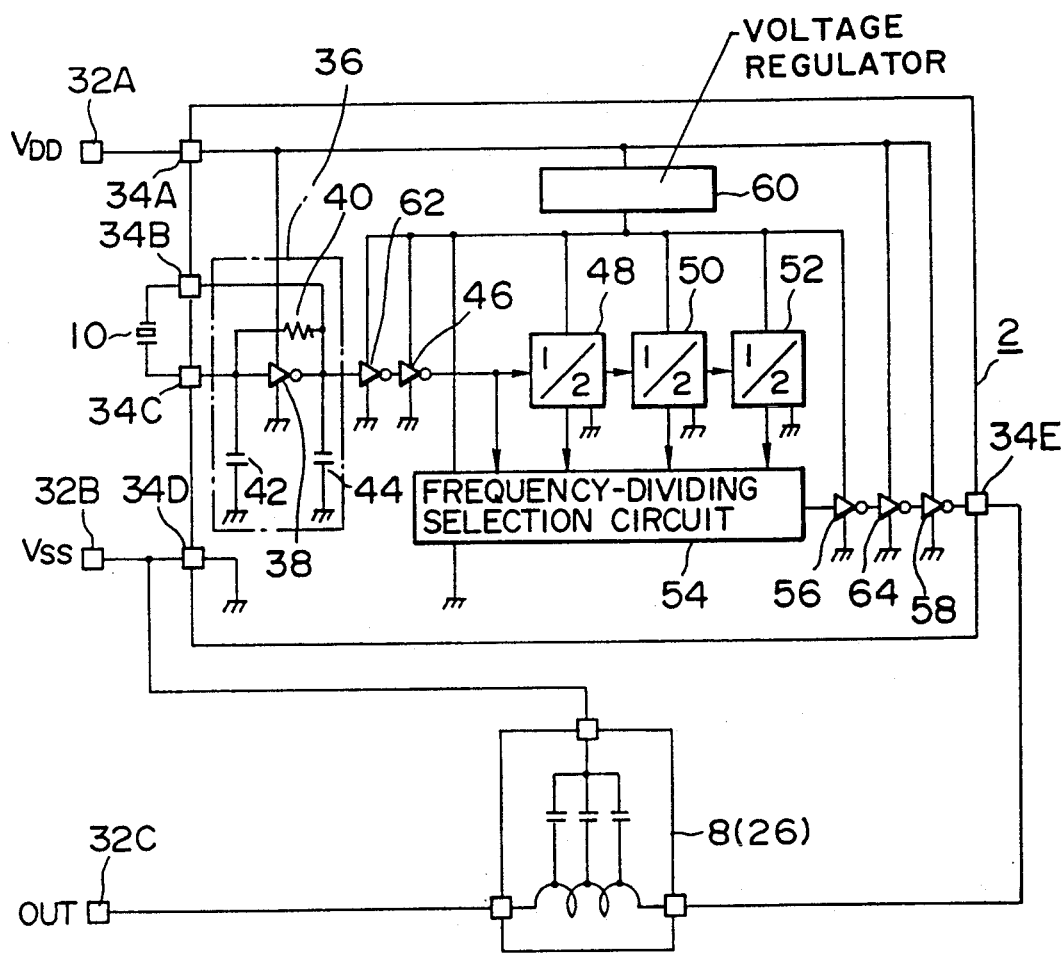
FIG. 14 is a circuit diagram of a quartz oscillator as a further embodiment of the present invention.

FIG. 14 is a circuit diagram of a quartz oscillator as a further embodiment of the present invention. In this embodiment, a low voltage obtained by the voltage regulator is applied to the respective parts (from the oscillation buffer 46 to the output pre-buffer 56). A level shifter 64 is provided between the output pre-buffer 56 and the output buffer 58 to transform a 3 V signal to a 5 V signal.

The noise stability of the output signal at the final stage is improved by increasing the level of the output signal.

Figure 15:
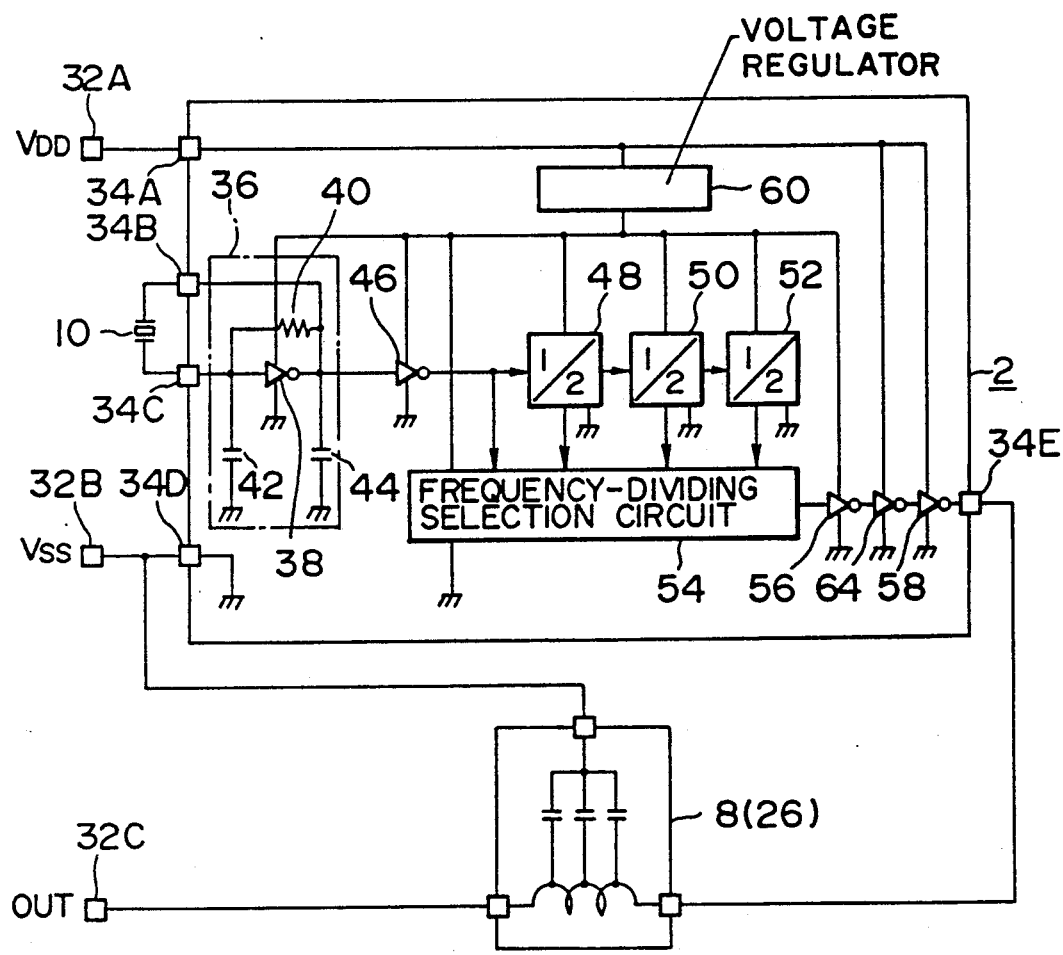
FIG. 15 is a circuit diagram of a quartz oscillator as a further embodiment of the present invention.

FIG. 15 is a circuit diagram of a quartz oscillator as a further embodiment of the present invention. In this embodiment, a low voltage obtained by the voltage regulator 60 is applied to the respective parts (from the oscillation circuit 36 to the output pre-buffer 56). The signal level of higher harmonic components is reduced by reducing all signal levels as shown in FIG. 15, so that radiation of the higher harmonic components can be reduced.

Figure 16:
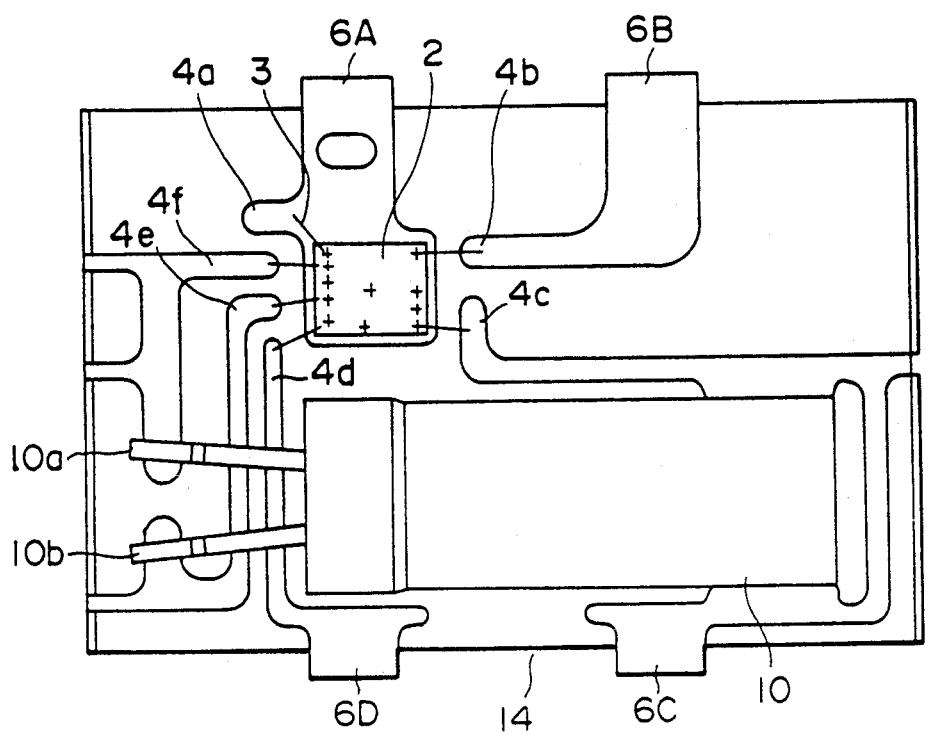
FIG. 16 is a plan view of a quartz oscillator as a further embodiment of the present invention.

FIG. 16 is a plan view of a quartz oscillator as a further embodiment of the present invention. In this embodiment, the lead frame of the lead terminal 4b is led directly to the outer lead 6B for outputting an oscillation signal without passing through the filter 8. In this embodiment, the quartz oscillator has a circuit structure formed by removing the filter 8 (26) from FIG. 11, FIG. 13, FIG. 14 or FIG. 15. That is, not only the output from the output pad 34E is led to the output terminal 32C but at least one part of the voltage for driving the circuit is provided as a low voltage. Because the voltage for driving the circuit is provided as a low voltage, the level of the signal becomes low. Accordingly, the signal level of higher harmonic components becomes low, so that radiation of the higher harmonic components can be reduced. The influence of the higher harmonic components can be reduced more remarkably by obtaining an oscillation signal little containing higher harmonic components by using a low-capacity MOSFET as the MOSFET constituting the oscillation inverter 38 of the oscillation circuit 36 in FIGS. 11, 13, 14 or 15 or by using the oscillation buffer 46 so as to be unsaturated.

Figure 17:
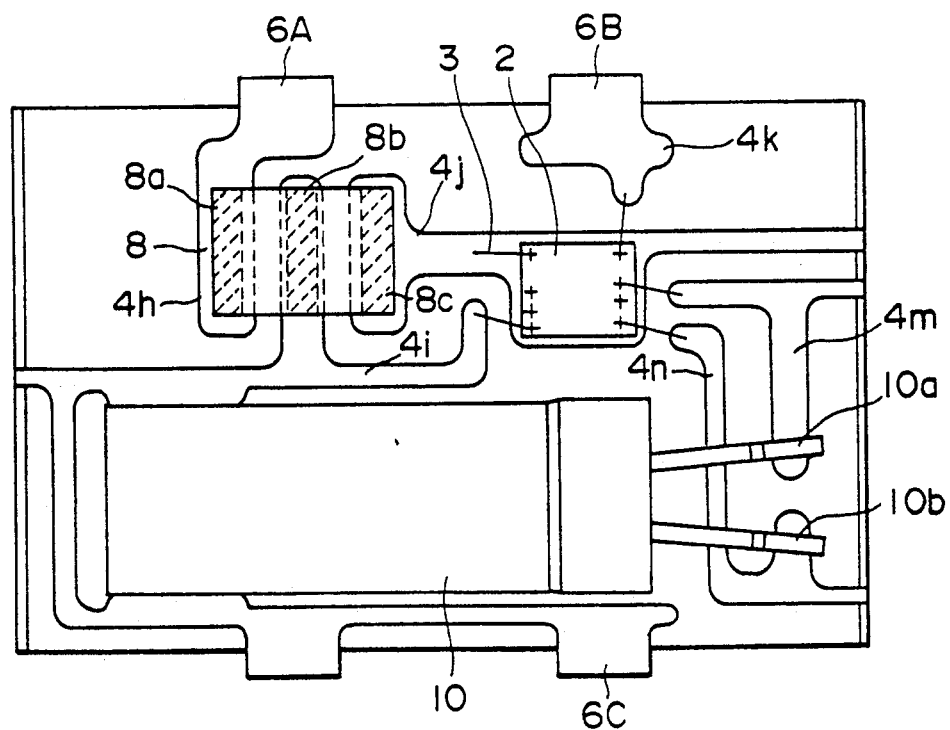
FIG. 17 is a plan view of a quartz oscillator as a further embodiment of the present invention.

FIG. 17 is a plan view of a quartz oscillator as a further embodiment of the present invention which is characterized in that a filter is provided in the electric source line. In this embodiment, the semiconductor device 2 is connected to lead terminals 4i, 4j, 4m and 4n (there are other several to tens of lead terminals which are however omitted in the drawing) by bonding with Au wires 3. The lead frame of the lead terminal 4h is connected to the outer lead 6A to which a source voltage VD is applied. Further, the input terminal 8a of the filter 8 is directly connected to the lead frame of the lead terminal 4h. The ground terminal 8 of the filter 8 is directly connected to the lead frame of the lead terminal 4i. Further, the lead frame of the lead terminal 4i is connected to the outer lead 6C connected to a ground potential. The output terminal of the filter 8 is directly connected to the lead frame of the lead terminal 4j. The lead frame of the lead terminal 4k is connected to the outer lead 6D for outputting an oscillation signal. The lead terminals 4m and 4n are connected to the outer leads 10a and 10b of the crystal resonator 10.

Also, in this embodiment, the filter 8 is connected, at the shortest distance, to the lead frame of the lead terminal 4i as a ground terminal of the semiconductor device 2 in order to improve the characteristic of the filter. The semiconductor device 2, the lead terminals 4h to 4k, 4m and 4n, the outer leads 6A to 6C, the filter 8 and the crystal resonator 10 as shown in FIG. 17 are packed by transfer molding using an epoxy resin or the like, so that the quartz oscillator 14 is formed.

In the quartz oscillator, the filter 8 is provided in the electric source line. Accordingly, higher harmonic components going out through the electric source line are cut, so that radiation of the higher harmonic components can be reduced.

Figure 18:
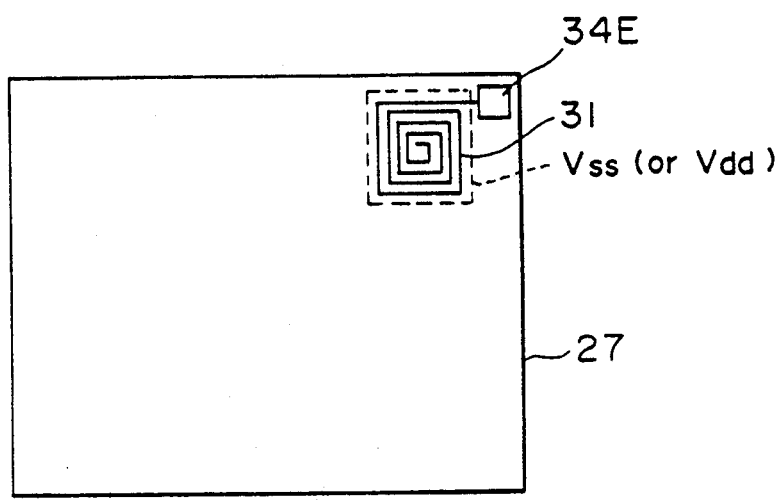
FIG. 18 is a plan view of an IC chip.
Figure 19:
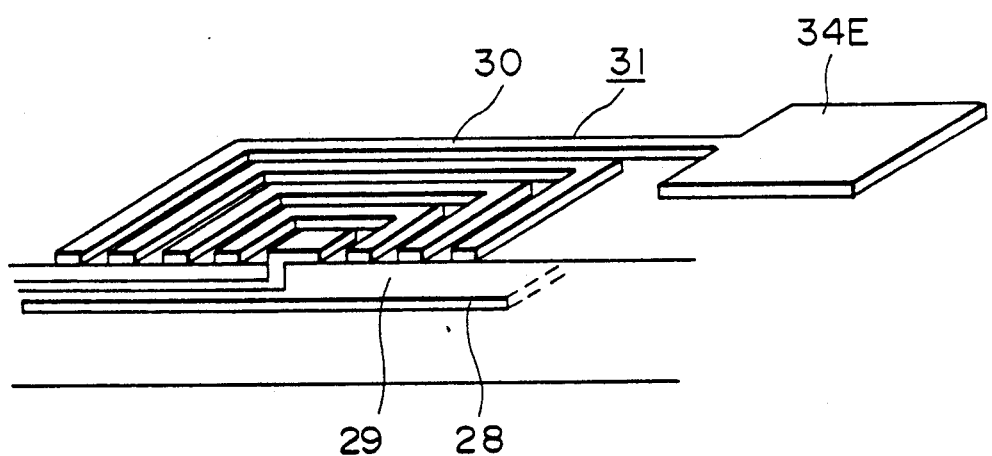
FIG. 19 is an enlarged perspective view of the IC chip.

FIG. 18 is a plan view of an example of an IC chip containing the aforementioned semiconductor device having a function of making a crystal resonator oscillate as an embodiment of the present invention, and FIG. 19 is an enlarged perspective view thereof. In this embodiment, a filter is provided in an IC chip. That is, a filter 31 is formed by forming a spiral pattern 30, through an electric insulating layer 29, in an upper portion of a VDD (or VCC) electrode 28 of an IC chip 27. In this embodiment, consideration is made so that a large electrostatic capacity can be provided by forming the filter 31 in the upper portion of the electrode 28. The pattern of the filter 31 is connected to the output pad 34E.

Figure 20:
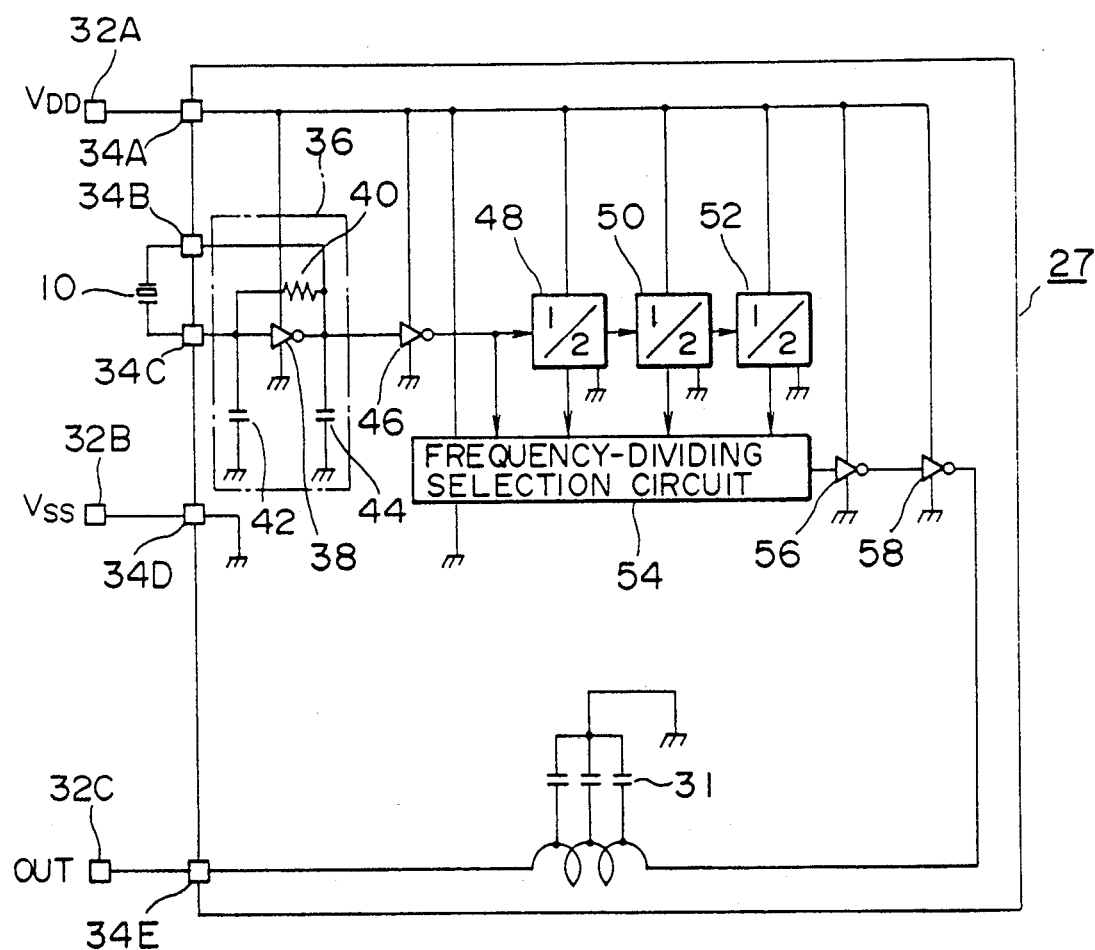
FIG. 20 is a circuit diagram of the IC chip depicted in FIGS. 18 and 19.

FIG. 20 is a circuit diagram of the IC chip depicted in FIGS. 18 and 19. In FIG. 20, when the oscillation circuit 36 makes the crystal resonator 10 oscillate, a signal from the crystal resonator 10 is amplified by the oscillation buffer 46. The amplified signal is frequency-divided by the frequency-dividing circuits 48 to 52, so that a signal divided with the frequency-dividing ratio selected by the frequency-dividing selection circuit 54 is taken out and amplified by the output pre-buffer 56 and the output buffer 58. The amplified signal is supplied to the filter 31. The signal supplied from the output buffer 58 to the filter 31 is further supplied to the output terminal 32C after higher harmonic components are cut. The filter 31 is arranged adjacent to the oscillation circuit 36 because the filter 31 is contained in the IC chip 27. Accordingly, higher harmonic components contained in the oscillation circuit 36 are cut at an early time, so that influence of the higher harmonic components can be reduced.

Figure 21:
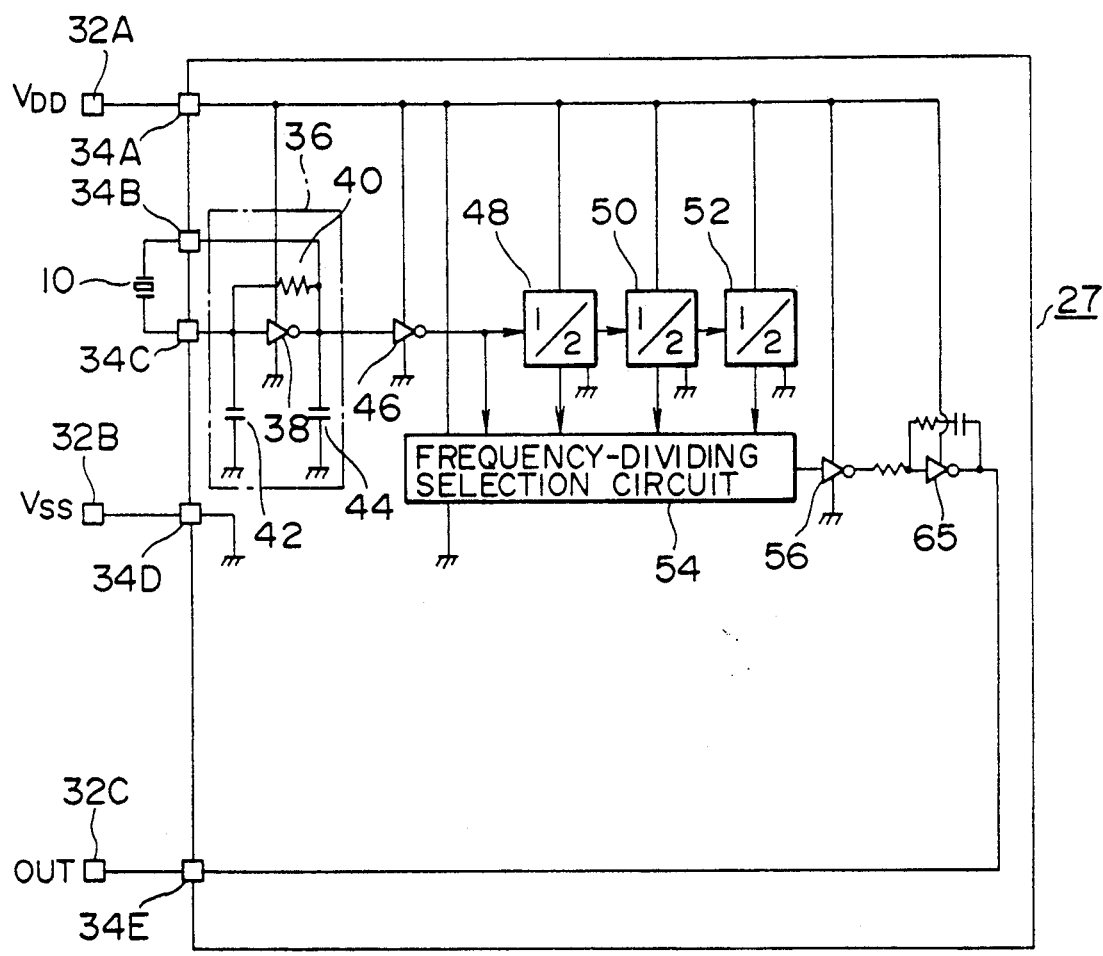
FIG. 21 is a circuit diagram of another embodiment of an IC chip.

FIG. 21 is a circuit diagram of another example of an IC chip as an embodiment of the present invention. In this embodiment, the output buffer 58 in FIG. 20 is constituted by an active low-pass filter 65, so that the same operation as in the embodiment of FIG. 20 can be provided without the provision of the filter 31.

The IC chip 27 containing the filter 31 as shown in FIGS. 18 to 20 may be used as the semiconductor device as shown in FIG. 1, 7, 9, 16 or 17. Alternatively, the IC chip 27 having the output buffer portion constituted by an active low-pass filter may be used as the semiconductor device.

Figure 22:
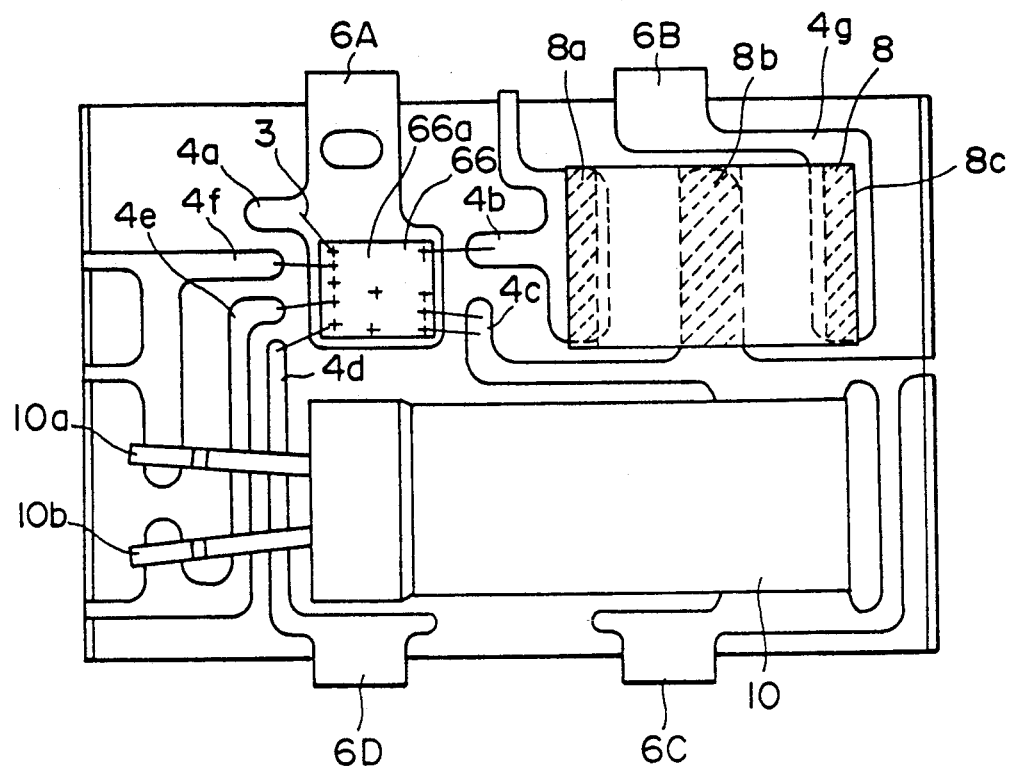
FIG. 22 is a plan view of a quartz oscillator as a further embodiment.
Figure 23:
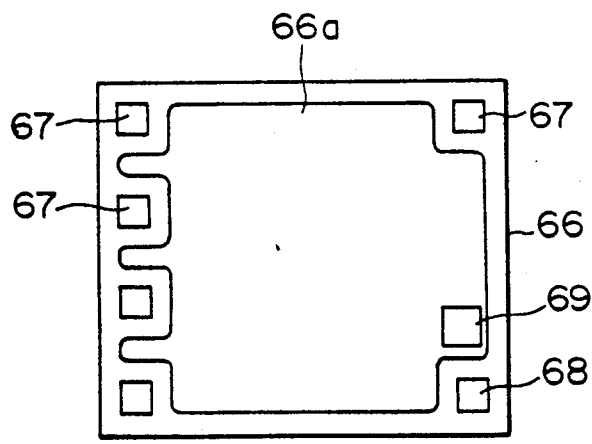
FIG. 23 is a plan view of the IC chip of the quartz oscillator depicted in FIG. 22.

FIG. 22 is a plan view of a quartz oscillator as a further embodiment, and FIG. 23 is a plan view of the IC chip depicted in FIG. 22. In this embodiment, a shielding film 66a is provided in an upper portion of an IC chip 66 containing a semiconductor circuit such as an oscillation circuit for making a crystal resonator oscillate. A ground pad 69 for the shielding film, as well as the bonding pad 67 and the VSS pad 68 generally provided, is provided in the periphery of the shielding film.

Figure 24:
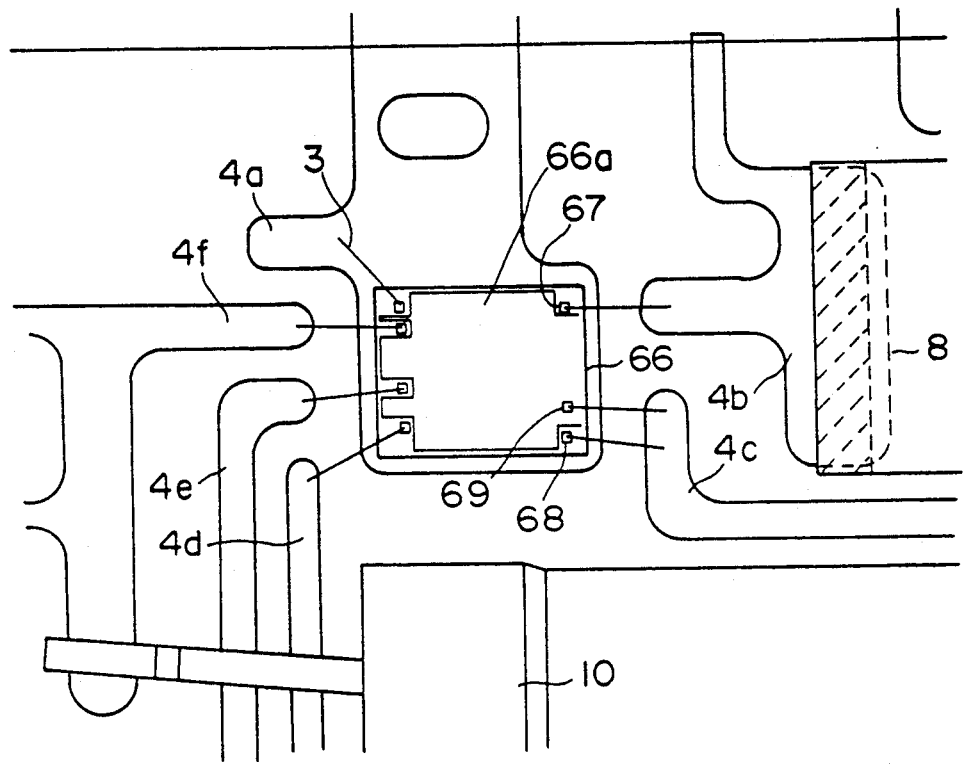
FIG. 24 is a detailed view showing the bonding of the IC chip depicted in FIG. 2.

FIG. 24 is a diagram showing the details of bonding in the IC chip 66, in which the ground pad 69 for the shielding film is bonded to the lead terminal 4c and connected to the outer lead 6C as a ground terminal.

Figure 25:
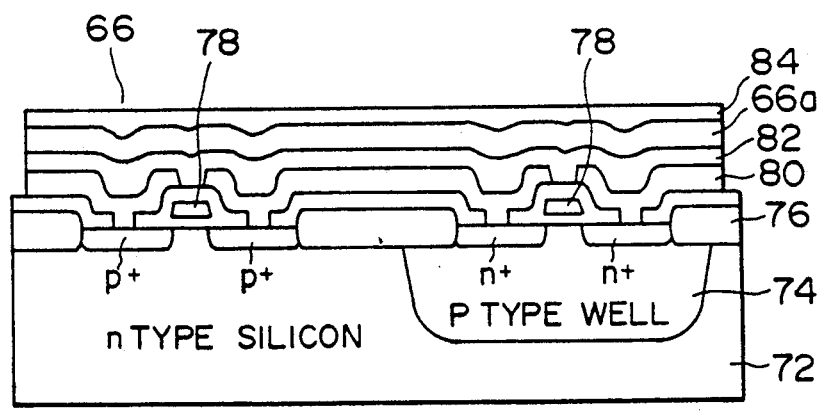
FIG. 25 is a sectional view of the IC chip depicted in FIG. 23.

FIG. 25 is a sectional view of the IC chip 66. As shown in FIG. 25, the IC chip 66 is composed of an n-type silicon 72, a p-type well 74, an $SiO_2$ 76, a polysilicon gate 78, an aluminum wiring 80 and an insulating film 82. The shielding film 66a is formed on the insulating film 82, and a protection film 84 is further formed on the shielding film 66a. Because the IC chip 66 per se is shielded by the shielding film 66a as described above, not only radiation of higher harmonic components can be shielded but noise from the outside can be avoided.

Figure 26:
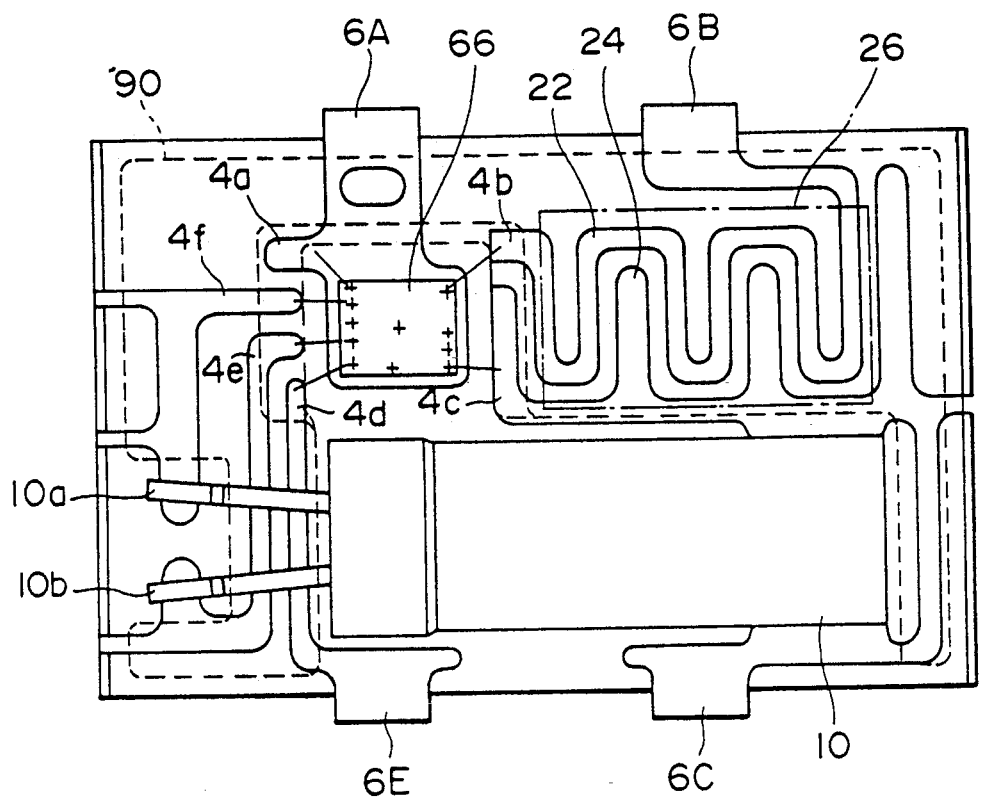
FIG. 26 is a plan view of a quartz oscillator as a further embodiment of the present invention.
Figure 27:
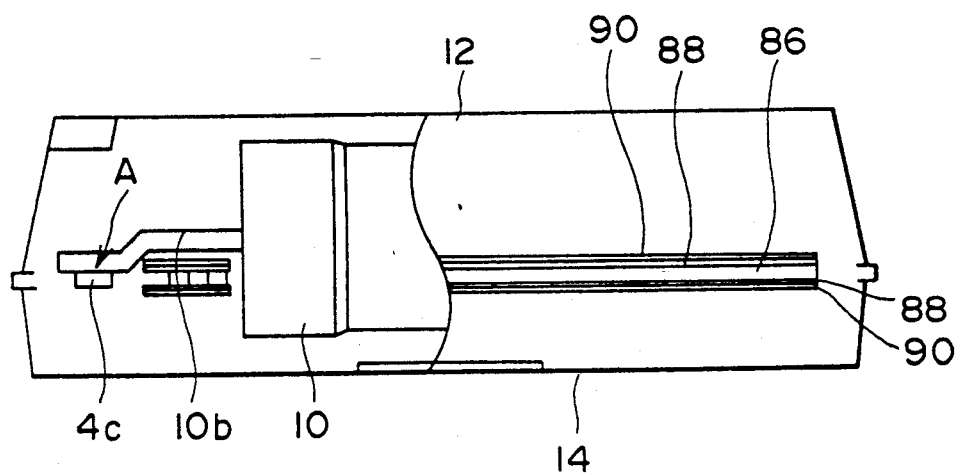
FIG. 27 is a front sectional view of the quartz oscillator depicted in FIG. 26.
Figure 28:
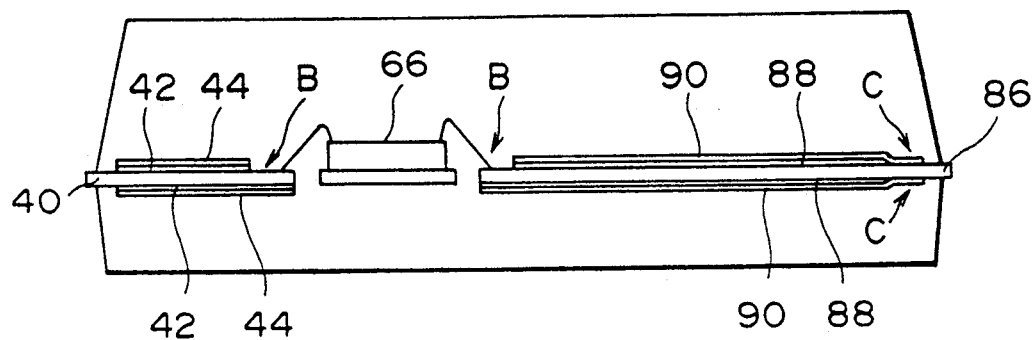
FIG. 28 is a front sectional view of the quartz oscillator depicted in FIG. 26.

FIG. 26 is a plan view of a quartz oscillator as a further embodiment of the present invention, and FIGS. 27 and 28 are front sectional views thereof. In this embodiment, two shielding plates 90 are provided so that a lead frame 86 is sandwiched therebetween. Specifically, the lead frame 86 is sandwiched between insulating layers 86 on which the shield plates 90 are provided respectively. The portion A of the lead frame connected to the outer leads 10a and 10b of the crystal resonator 10 is formed so that the outer leads 10a and 10b can be connected to the lead frame 86 without providing the insulating layers 88 and the shielding plates 90. Like this, the portion B of the lead frame 86 bonded as shown in FIG. 28 has no insulating layer 88 and no shielding plate 90. As shown in FIG. 28, the shielding plates 90 are connected to a portion C of the lead frame connected to the outer lead 6C of the ground terminal, without providing any insulating layer 88 in the portion C of the lead frame 86, so that the shielding plates are provided as a ground potential.

In the quartz oscillator having the aforementioned structure, the whole portion except the IC chip 66 and the crystal resonator 10 is covered with the shielding plates 90. Accordingly, not only radiation of higher harmonic components from the lead frame can be prevented but external noise can be avoided. Furthermore, the capacity of the lead frame in the VDD line, signal line or the like, is enlarged to increase a filtering effect. Particularly, in the filter 26 composed of lead frames 22 and 24, the capacity thereof is enlarged more remarkably.

Figure 29:
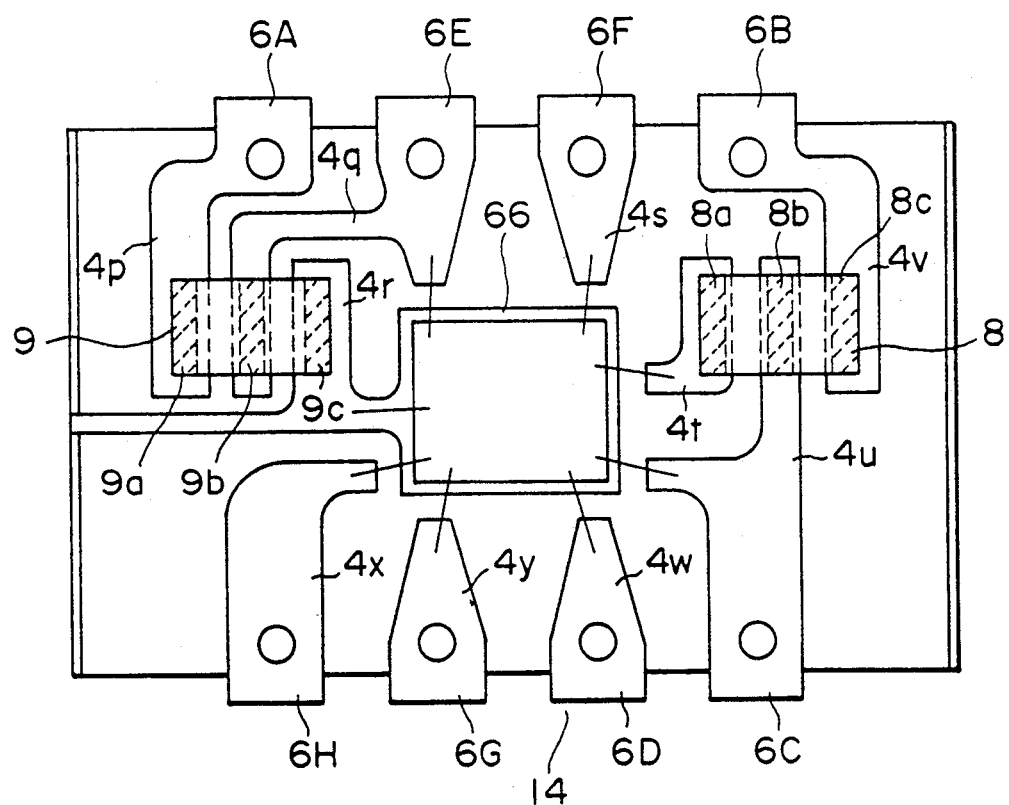
FIG. 29 is a plan view of a quartz oscillator as a further embodiment of the present invention.
Figure 30:
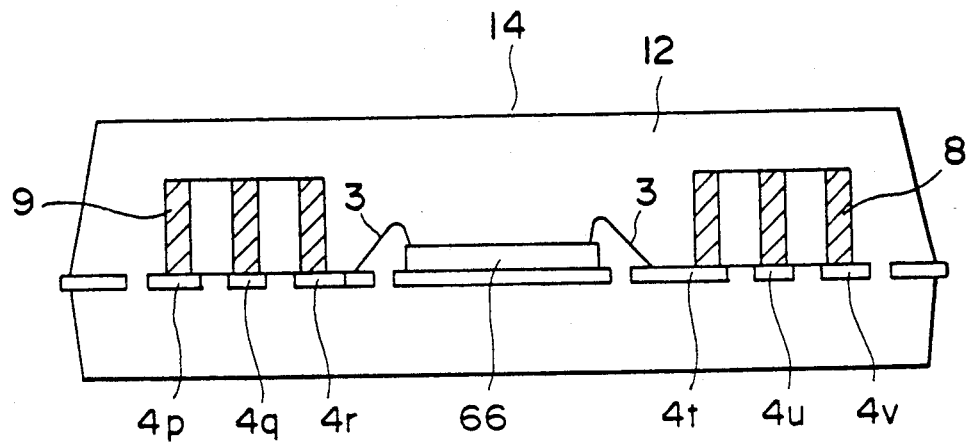
FIG. 30 is a front sectional view of the quartz oscillator depicted in FIG. 29.

FIG. 29 is a plan view of a quartz oscillator as a further embodiment of the present invention, and FIG. 30 is a front sectional view thereof. In this embodiment, the IC 66 contains an oscillation circuit or a semiconductor device as explained in the aforementioned embodiments. The IC 66 is connected to lead terminals 4r to 4u and 4w to 4y (there are other several to tens of lead terminals which are however omitted in the drawing) by bonding with Au wires 3. The lead frame of the lead terminal 4p is connected to the outer lead 6A to which a source voltage VDD is applied. The lead frame of the lead terminal 4q is connected to the outer lead 6E connected to a ground potential. The lead terminal 4r is connected, through an Au wire 3, to an IC 66 to which a source voltage VDD is applied. For example, the lead frame of the lead terminal 4s is connected to the outer lead 6F for inputting a control signal. The lead terminal 4t is connected to the IC 66 through an Au wire 3, so that an output signal from the IC 66 is supplied to the lead terminal 4t. The lead frame of the lead terminal 4u is connected to the outer lead 6C connected to the ground potential. The lead frame of the lead terminal 4v is connected to the outer lead 6B for sending out an output signal. The lead frames of the lead terminals 4w, 4x and 4y are connected to the outer leads 6D, 6G and 6H, respectively.

The input terminal 8a, the ground terminal 8b and the output terminal 8c of the filter 8 are directly connected to the lead terminals 4t, 4u and 4v, respectively. The filter 8 is connected between the output terminal of the IC 66 and the outer lead 6B. The input terminal 9a, the ground terminal 9b and the output terminal 9c of a filter 9 are directly connected to the lead terminals 4p, 4q and 4r, respectively. The filter 9 is connected between the outer lead 6A to which a source voltage VDD is applied and the source terminal of the IC 66. The filter 9 has the same structure as that of the filter 8. These IC 66, the filters 8 and 9 and the like are packed in a package 12 in the same manner as in the embodiment to thereby form an oscillation circuit 14.

In the embodiment shown in FIGS. 29 and 30, the filter 8 is provided in the output side of the IC 66, so that higher harmonic components contained in the output signal are removed. Further, the filter 9 is provided between the outer lead 6A (for electric source) and the source terminal of the IC 66, so that higher harmonic components going out from the IC 66 through the electric source line are removed. Because higher harmonic components are removed as described above, radiation of the components can be reduced.

Any one of plastic, metal and ceramic packages may be used for the piezoelectric oscillator or electronic part as the subject of the present invention. Either of dual type and surface mounting type packages may be used.

Although the aforementioned embodiments have shown the case where the present invention is applied to an oscillator as one of electronic parts, the present invention can be applied to an IC (for example, high-speed IC) containing another circuit high in switching speed. Although the aforementioned embodiments have shown the case where the filter is constituted by a distributed constant filter, the present invention can be applied to the case where the filter is constituted by a concentrated constant filter.

Figure 31:
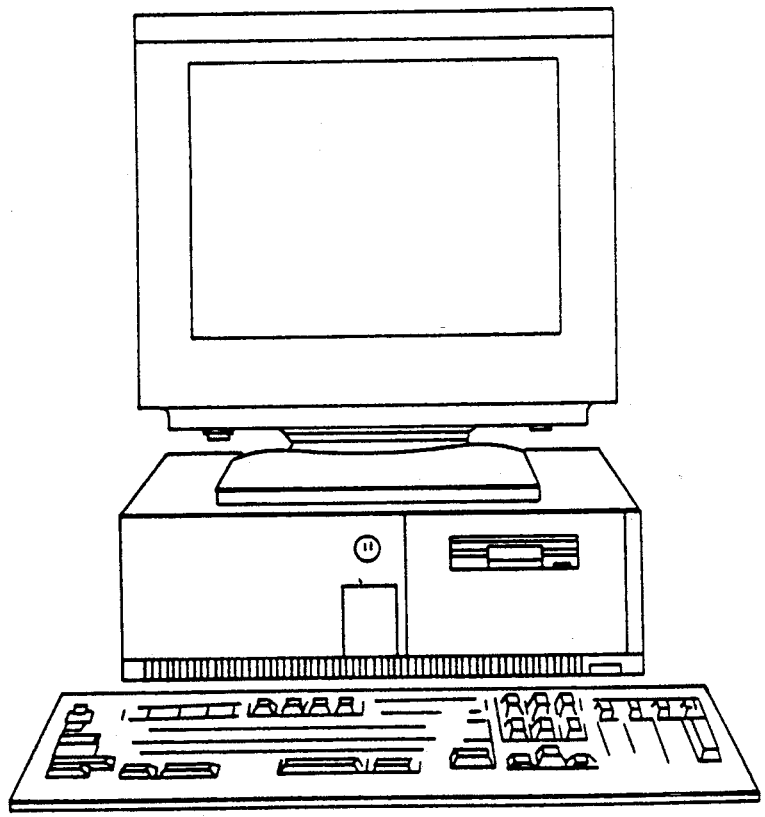
FIG. 31 is a front view of a personal computer self-containing the quartz oscillator.

In addition, the present invention can be applied to an electronic apparatus containing electronic parts such as a piezoelectric oscillator or the like. For example, the present invention can be applied to an electronic apparatus such as a pager, a facsimile, a personal computer shown in FIG. 31, etc.

What is claimed is:

1. A piezoelectric oscillator comprising a piezoelectric vibrator, a semiconductor device provided therein with an oscillation circuit for making said piezoelectric vibrator oscillate, and a filter for cutting components in a predetermined frequency band or higher harmonic components of an oscillation signal outputted from said semiconductor device, wherein said filter is provided in the output side of said semiconductor device and said piezoelectric vibrator, said semiconductor device and said filter are packed in one package.

2. A piezoelectric oscillator according to claim 1, wherein said filter includes a distributed constant noise attenuation element.

3. A piezoelectric oscillator according to claim 1, wherein said filter includes a pair of meandering lead frames arranged so as to be opposite to each other at a predetermined distance.

4. A piezoelectric oscillator according to claim 1, wherein said semiconductor device is provided therein with at least one oscillation circuit and at least one output buffer and further provided therein a voltage regulator for applying a low voltage as a driving voltage to at least part of said oscillation circuit and said output buffer.

5. A piezoelectric oscillator comprising a piezoelectric vibrator, a semiconductor device provided therein with an oscillation circuit for making said piezoelectric vibrator oscillate, and a filter for cutting components in a predetermined frequency band or higher harmonic components of an oscillation signal outputted from said semiconductor device, wherein said filter is provided in an electric source line for supplying a driving voltage to said semiconductor device, and said piezoelectric vibrator, said semiconductor device and said filter are packed in one package.

6. A piezoelectric oscillator comprising a piezoelectric vibrator, a semiconductor device provided therein with an oscillation circuit for making said piezoelectric vibrator oscillate, and a filter for cutting components in a predetermined frequency band or higher harmonic components of an oscillation signal outputted from said semiconductor device, and said piezoelectric vibrator, said semiconductor device, and said filter being packed in one package, said semiconductor device and said filter being contained in an IC chip.

7. A piezoelectric oscillator according to claim 6, wherein said filter is provided in an input or output line of said semiconductor device and includes cancel lines arranged to interfere with each other to cancel radiation.

8. A piezoelectric oscillator according to claim 7, wherein said cancel lines include a pair of meandering lead frames arranged so as to be opposite to each other at a predetermined distance.

9. A piezoelectric oscillator according to claim 6, wherein said semiconductor device is contained in an IC chip having an upper surface covered with a shielding film.

10. A piezoelectric oscillator according to claim 6, further comprising a lead frame sandwiched between shielding plates through insulating layers respectively.

11. A piezoelectric oscillator comprising a piezoelectric vibrator, and a semiconductor device having a function of making said piezoelectric vibrator oscillate, said semiconductor device being provided thereon with at least one oscillation circuit and at least one output buffer connected to the output of said oscillation circuit and further provided therein with a voltage regulator for applying a first voltage to said oscillator circuit and a second voltage lower than the first voltage to said output buffer, wherein said piezoelectric vibrator and said semiconductor device are packed in one package.

12. An electronic part comprising, a piezoelectric vibrator, a semiconductor device provided therein with an oscillator circuit for making said piezoelectric vibrator oscillate, and a filter for cutting components in a predetermined frequency band or higher harmonic components of an oscillation signal outputted from said semiconductor device, wherein said piezoelectric vibrator, said semiconductor device and said filter are packed in one package, and said semiconductor device and said filter are contained in an IC chip.

13. An electronic apparatus comprising a piezoelectric oscillator incorporated therein, said piezoelectric oscillator comprising a piezoelectric vibrator, a semiconductor device provided therein with an oscillation circuit for making said piezoelectric vibrator oscillate, and a filter for cutting components in a predetermined frequency band or higher harmonic components of an oscillation signal outputted from said semiconductor device, wherein said piezoelectric vibrator, said semiconductor device and said filter are packed in one package, and said semiconductor device and said filter being contained in an IC chip.

* * * * *